(12) United States Patent
Chen (10) Patent No.: US 11,088,267 B2
(45) Date of Patent: Aug. 10, 2021

(54) SEMICONDUCTOR DEVICE WITH DIODE AND SILICON CONTROLLED RECTIFIER (SCR)

(71) Applicant: IPU SEMICONDUCTOR CO., LTD., Miaoli County (TW)

(72) Inventor: Chih-Hao Chen, Hsinchu County (TW)

(73) Assignee: IPU SEMICONDUCTOR CO., LTD., Miaoli County (TW)

( * ) Notice: Subject to any disclaimer, the term of this patent is extended or adjusted under 35 U.S.C. 154(b) by 0 days.

(21) Appl. No.: 16/823,334

(22) Filed: Mar. 19, 2020

(65) Prior Publication Data

US 2020/0365716 A1   Nov. 19, 2020

(30) Foreign Application Priority Data

May 15, 2019   (TW) .................. 108116674

(51) Int. Cl.
*H01L 29/74*   (2006.01)
*H01L 29/747*   (2006.01)
*H01L 27/02*   (2006.01)

(52) U.S. Cl.
CPC ...... *H01L 29/7412* (2013.01); *H01L 27/0262* (2013.01); *H01L 29/747* (2013.01)

(58) Field of Classification Search
CPC ... H01L 29/7412; H01L 29/747; H01L 29/87; H01L 29/861; H01L 27/0255; H01L 27/0262; H01L 29/808; H01L 29/0692; H01L 29/1095; H01L 29/0634; H01L 29/7835; H01L 29/66901; H01L 29/7816; H01L 29/1066; H01L 29/78; H01L 29/66681; H01L 29/0615; H01L 29/0661; H01L 29/0623; H01L 29/0865; H01L 29/0886; H01L 29/41725; H01L 29/4238; H01L 29/0834; H01L 29/73; H01L 29/8086; H01L 29/7811; H01L 29/0619; H01L 29/0649; H01L 29/0653; H01L 29/0696; H01L 29/7832; H01L 29/0847; H01L 29/66659; H01L 29/7838;

(Continued)

(56) References Cited

U.S. PATENT DOCUMENTS

| 6,765,771 | B2 * | 7/2004 | Ker | ..................... H01L 27/0262 |
| | | | | 257/E29.225 |
| 7,408,754 | B1 * | 8/2008 | O | ....................... H01L 27/0262 |
| | | | | 361/91.1 |

(Continued)

*Primary Examiner* — Natalia A Gondarenko
(74) *Attorney, Agent, or Firm* — Li & Cai Intellectual Property Office (57) ABSTRACT

Provided is a semiconductor device with a diode and a silicon controlled rectifier (SCR) including a substrate having a first conductivity type, a well region having a second conductivity type, a first doped region having the first conductivity type, and a second doped region having the second conductivity type. The well region is disposed in the substrate. The first doped region is disposed in the substrate. The second doped region is disposed in the substrate. The well region and the first doped region form a first PN junction, the well region and the substrate form a second PN junction, and the substrate and the second doped region form a third junction. The first, second, and third PN junctions form the SCR, and the first doped region and the third PN junction form the diode.

8 Claims, 7 Drawing Sheets

(58) Field of Classification Search
CPC ............ H01L 29/0843; H01L 29/0882; H01L 29/1083; H01L 29/41758; H01L 29/42316; H01L 29/6606; H01L 29/66893; H01L 29/66568; H01L 29/66674; H01L 29/70; H01L 29/7424; H01L 29/7801; H01L 29/7809; H01L 29/80; H01L 2924/13091; H01L 2924/1305; H01L 2924/13055; H01L 2924/13062; H01L 27/0259; H01L 27/0266; H01L 27/0623; H01L 27/098; H01L 27/0617
USPC ....... 257/133, 285, 341, 355, 343, 344, 379, 257/E29.174, E29
See application file for complete search history.

(56) References Cited

U.S. PATENT DOCUMENTS

| | | |
|---|---|---|
| 7,538,997 B2 | 5/2009 | Mallikararjunaswamy |
| 7,548,401 B2 | 6/2009 | Mergens et al. |
| 7,919,817 B2 | 4/2011 | Mallikarjunaswamy |
| 8,218,276 B2 | 7/2012 | Mallikarjunaswamy |
| 8,754,479 B2 * | 6/2014 | Otake ................ H01L 27/0259 257/355 |
| 10,043,790 B2 | 8/2018 | Chen |
| 10,217,733 B2 * | 2/2019 | Marreiro ............ H01L 27/0262 |
| 2015/0069424 A1 * | 3/2015 | Willemen ........... H01L 27/0629 257/84 |

* cited by examiner

SEMICONDUCTOR DEVICE WITH DIODE AND SILICON CONTROLLED RECTIFIER (SCR)

CROSS-REFERENCE TO RELATED APPLICATION

This application claims the priority benefit of Taiwan application serial no. 108116674, filed on May 15, 2019. The entirety of the above-mentioned patent application is hereby incorporated by reference herein and made a part of this specification.

BACKGROUND OF THE INVENTION

Field of the Invention

The present invention relates to a semiconductor device with a diode and a silicon controlled rectifier (SCR).

Description of Related Art

With the rapid development of current technology, integrated circuits are widely used in electronic devices. Electrostatic discharge (ESD) events are one of the main problems that cause damage to integrated circuits.

In the conventional technical field, transient voltage suppressors (TVS) are often used for electrostatic discharge protection. However, since the transient voltage suppressors need to withstand high power energy, its bypass diode must be designed with a large area of PN junction to withstand high power energy. When the area of the PN junction is larger, the parasitic capacitance is also larger, which leads to a slower operation speed. On the other hand, if a small-area diode structure is selected to reduce parasitic capacitance, the resistance value of the device will increase, thereby increasing the clamping voltage of the device accordingly, which will cause the ESD protection capability to decrease. Therefore, how to provide a semiconductor device having both low capacitance, low clamping voltage, and high ESD protection capability as a bypass diode in a transient voltage suppressor (TVS) will become an important subject.

SUMMARY OF THE INVENTION

The invention provides a semiconductor device with a diode and a silicon controlled rectifier (SCR), so that the semiconductor device of the present invention has both low capacitance, low clamping voltage, and high ESD protection capability.

The invention provides a semiconductor device with a diode and a silicon controlled rectifier (SCR) including a substrate having a first conductivity type, a well region having a second conductivity type, a first doped region having the first conductivity type, and a second doped region having the second conductivity type. The well region is disposed in the substrate. The first doped region is disposed in the substrate. The second doped region is disposed in the substrate. The well region and the first doped region form a first PN junction, the well region and the substrate form a second PN junction, and the substrate and the second doped region form a third junction. The first, second, and third PN junctions form the SCR, and the first doped region and the third PN junction form the diode.

In the semiconductor device provided by the present invention, a portion of the first doped region is located in the well region.

In the semiconductor device provided by the present invention, the second doped region is separated from the well region and the first doped region.

In the semiconductor device provided by the present invention, the substrate and the well region are both electrically floating.

In the semiconductor device provided by the present invention, a current path of the diode is formed from the second doped region, the substrate to the first doped region. A current path of the SCR is formed from the second doped region, the substrate, the well region to the first doped region.

In the semiconductor device provided by the present invention, the first doped region includes a first doped sub-region and a second doped sub-region. The second doped sub-region is located on the first doped sub-region. The first doped sub-region has a doping concentration greater than a doping concentration of the second doped sub-region.

In the semiconductor device provided by the present invention, the well region has a first well region and a second well region separated from each other, the first doped region is located between the first and second well regions, the first doped region is in contact with the first and second well regions respectively to form PN junctions, and the first doped region is in contact with the substrate.

In the semiconductor device provided by the present invention, the semiconductor device further includes a third doped region having the second conductivity type and disposed in the substrate. The third doped region is separated from the well region by the substrate, and the first doped region is located between the second and third doped regions.

Based on the above, in the present invention, a diode and a silicon controlled rectifier (SCR) are integrated into a bypass diode structure in a transient voltage suppressor (TVS). The hybrid structure not only has the advantages of the diode including small area, low capacitance, and fast turn-on, but also has the characteristics of the SCR including high current gain and low clamping voltage, thereby achieving better ESD protection effect.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is more blanketly described with reference to the figures of the present embodiments. However, the invention can also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

In the following embodiments, when the first conductivity type is P-type, the second conductivity type is N-type; when the first conductivity type is N-type, the second conductivity type is P-type. In the present embodiment, the first conductivity type is N type and the second conductivity type is P type. However, the present invention is not limited thereto.

Figure 1:
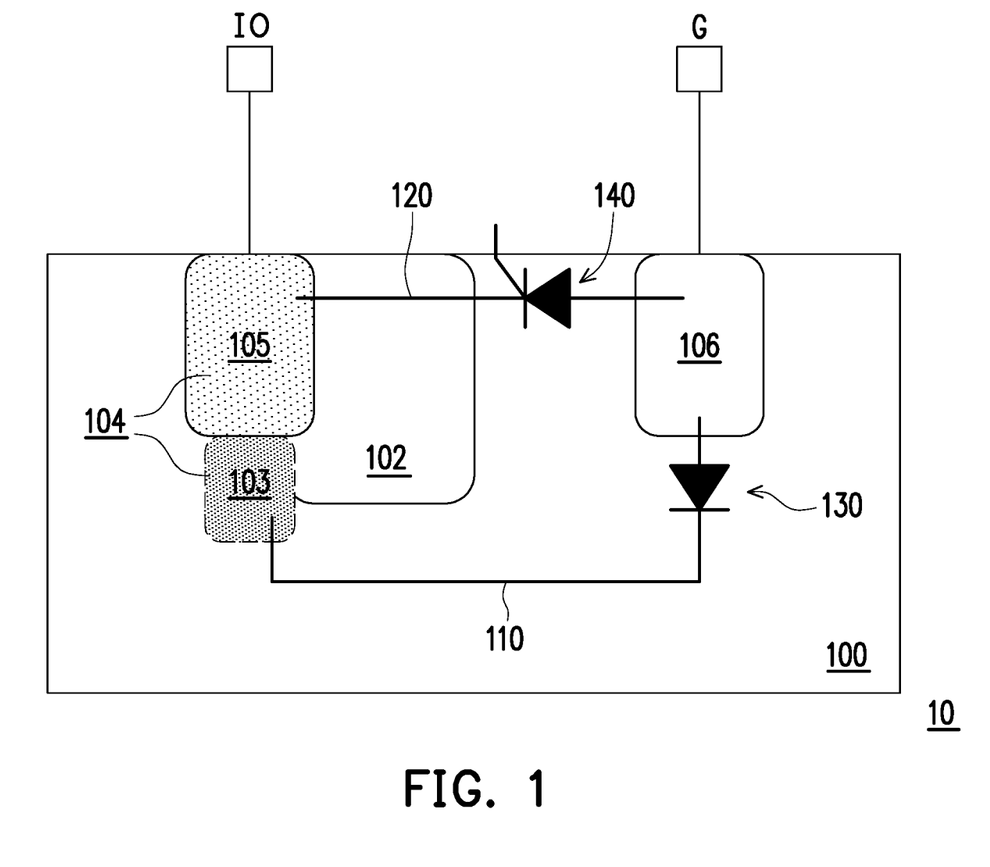
FIG. 1 is a schematic cross-sectional view of a semiconductor device according to a first embodiment of the invention.

FIG. 1 is a schematic cross-sectional view of a semiconductor device according to a first embodiment of the invention.

Referring to FIG. 1, in the first embodiment, a semiconductor device 10 includes a substrate 100, a well region 102, a first doped region 104, and a second doped region 106. In one embodiment, the substrate 100 may be a semiconductor substrate, a semiconductor compound substrate, or a semiconductor over insulator (SOI) substrate, for example. In the present embodiment, the substrate 100 may have a first conductivity type, which may be an N-type silicon substrate and electrically floating, for example.

The well region 102 may have a second conductivity type and is disposed in the substrate 100. In one embodiment, the dopant of the well region 102 may be boron or boron difluoride. For example, the well region 102 may be a P-type well region and is electrically floating.

The first doped region 104 may have the first conductivity type and is disposed in the substrate 100 aside the well region 102. Specifically, as shown in FIG. 1, a portion of the first doped region 104 is located in the well region 102 and is in (physical) contact with the well region 102. Another portion of the first doped region 104 is located outside or exposed from the well region 102 and is in (physical) contact with the substrate 100. In the present embodiment, the first doped region 104 includes a first doped sub-region 103 and a second doped sub-region 105 located on the first doped sub-region 103. A bottom surface of the first doped sub-region 103 may be lower than a bottom surface of the well region 102, but the invention is not limited thereto. In another embodiment, the first doped sub-region 103 has a doping concentration greater than a doping concentration of the second doped sub-region 105. In alternative embodiments, the dopants of the first doped sub-region 103 and the second doped sub-region 105 are phosphorus or arsenic, for example.

The second doped region 106 may have the second conductivity type. The second doped region 106 is disposed in the substrate 100 and separated from the well region 102 and the first doped region 104. In one embodiment, the dopant of the second doped region 106 is boron or boron difluoride, for example. Specifically, as shown in FIG. 1, the second doped region 106 is separated from the well region 102 by the substrate 100, and the well region 102 is located between the first doped region 104 and the second doped region 106. That is, the second doped region 106 having the same conductivity type as the well region 102 will not contact the well region 102; while the first doped region 104 having a different conductivity type from the well region 102 will contact the well region 102.

It should be noted that a first PN junction is formed between the well region 102 and the first doped region 104, a second PN junction is formed between the well region 102 and the substrate 100, and a third PN junction is formed between the substrate 100 and the second doped region 106. As shown in FIG. 1, the first, second, and third PN junctions form a silicon controlled rectifier structure 140 having three PN junctions, while the first doped region 104 and the third PN junction form a diode structure 130 with a single PN junction. In the present embodiment, the first doped region 104 is coupled to the input/output terminal IO and the second doped region 106 is coupled to the ground terminal G. In the case, a current path 110 of the diode 130 may be formed from the second doped region 106, the substrate 100 to the first doped region 104, while a current path 120 of the silicon controlled rectifier structure 140 may be formed from the second doped region 106, the substrate 100, the well region 102 to the first doped region 104. In alternative embodiments, the current path 120 of the silicon controlled rectifier structure 140 is closer to the top surface of the substrate 100 than the current path 110 of the diode structure 130.

Figure 2:
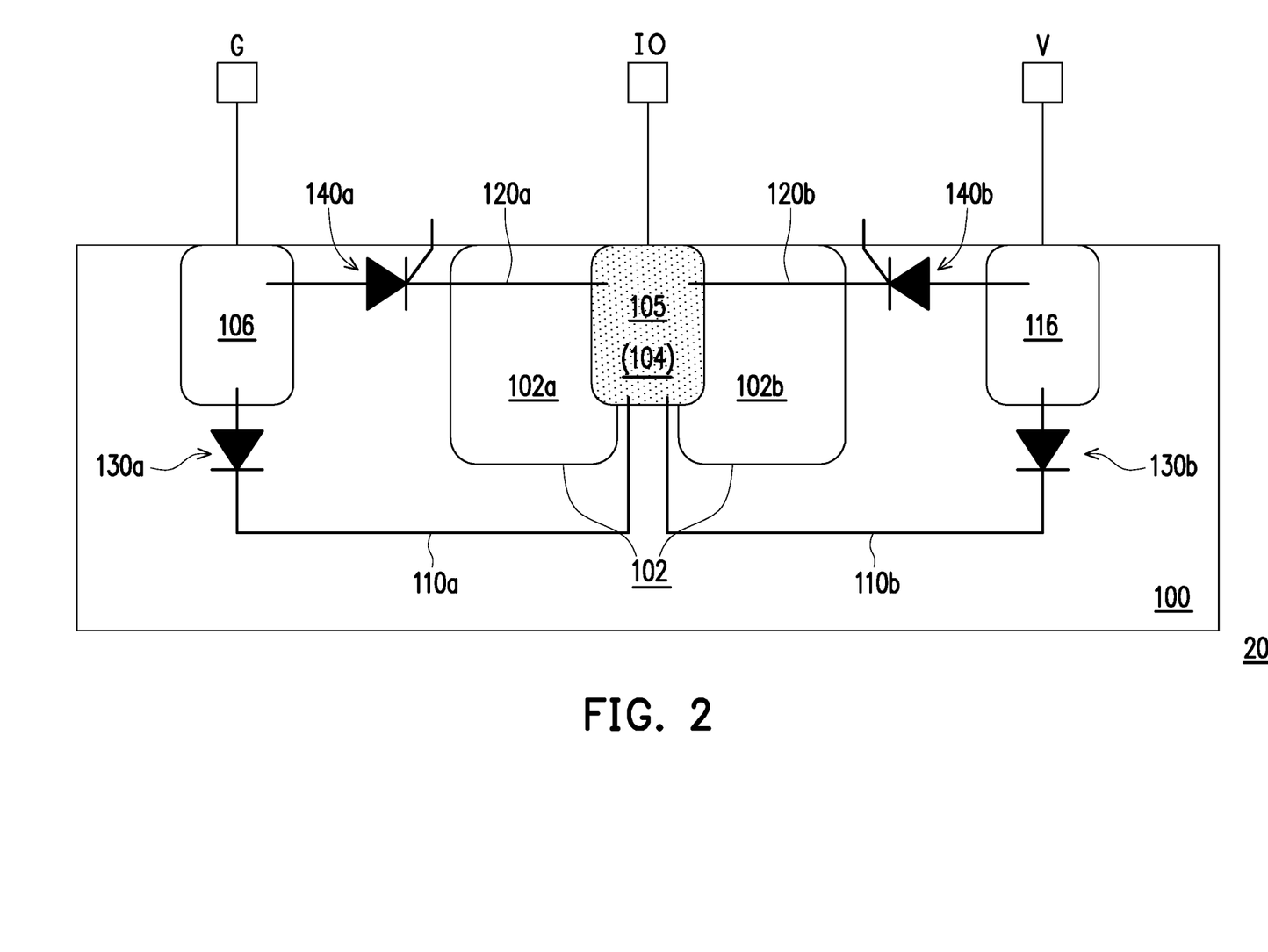
FIG. 2 is a schematic cross-sectional view of a semiconductor device according to a second embodiment of the invention.

FIG. 2 is a schematic cross-sectional view of a semiconductor device according to a second embodiment of the invention.

Referring to FIG. 2, in the second embodiment, a semiconductor device 20 includes a substrate 100 having a first conductivity type, a well region 102 having a second conductivity type, a first doped region 104 having the first conductivity type, and a second doped region having the second conductivity type 106, and a third doped region 116 having the second conductivity type.

Specifically, the well region 102 is divided into a first well region 102a and a second well region 102b by the first doped region 104. That is, the well region 102 has the first well region 102a and the second well region 102b separated from each other, the first doped region 104 is located between the first well region 102a and the second well region 102b, and the first doped region 104 is in contact with the first well region 102a and the second well region 102b respectively to form PN junctions. The sidewalls of the first doped region 104 extend into the first well region 102a and the second well region 102b respectively, so that the sidewalls and a portion of the bottom surface of the first doped region 104 are covered or wrapped by the first and second well regions 102a and 102b, while another portion of the bottom surface of the first doped region 104 is exposed by the first and second well regions 102a and 102b. As shown in FIG. 1, the another portion of the bottom surface of the first doped region 104 exposed by the first and second well regions 102a and 102b is in (physical) contact with the substrate 100. In one embodiment, the bottom surface of the first doped region 104 is higher than the bottom surfaces of the first and second well regions 102a and 102b, but the invention is not limited thereto.

As shown in FIG. 2, the second doped region 106 is located on a side of the first doped region 104 adjacent to the first well region 102a, and the third doped region 116 is located on another side of the first doped region 104 adjacent to the second well region 102b. That is, the first doped region 104 is located between the second doped region 106 and the third doped region 116, and the first doped region 104 is disposed in the substrate 100 and separated from the second doped region 106 and the third doped region 116. The second doped region 106 and the third doped region 116 having the same conductivity type as the well region 102 will not contact the well region 102, while the first doped region 104 having a different conductivity type from the well region 102 will contact the well region 102. In one embodiment, the dopant of the third doped region 116 is boron or boron difluoride, for example. In alternative embodiments, the third doped region 116 has a doping concentration the same as a doping concentration of the second doped region 106.

In the present embodiment, the first doped region 104 is coupled to the input/output terminal IO; the second doped region 106 is coupled to the ground terminal G; and the third doped region 116 is coupled to the power terminal V. In the case, a current path 110a of the diode 130a may be formed from the second doped region 106, the substrate 100 to the first doped region 104; while a current path 120a of the silicon controlled rectifier 140a may be formed from the second doped region 106, the substrate 100, the first well region 102a to the first doped region 104. Similarly, a current path 110b of another diode 130b may be formed from the third doped region 116, the substrate 100 to the first doped region 104; while a current path 120b of another silicon controlled rectifier 140b may be formed from the third doped region 116, the substrate 100, the second well region 102b to the first doped region 104. In the present embodiment, the semiconductor device 20 may be regarded as a multi-channel structure, which is configured in a mirror-symmetric manner with the first doped region 104 as a central axis.

Figure 3:
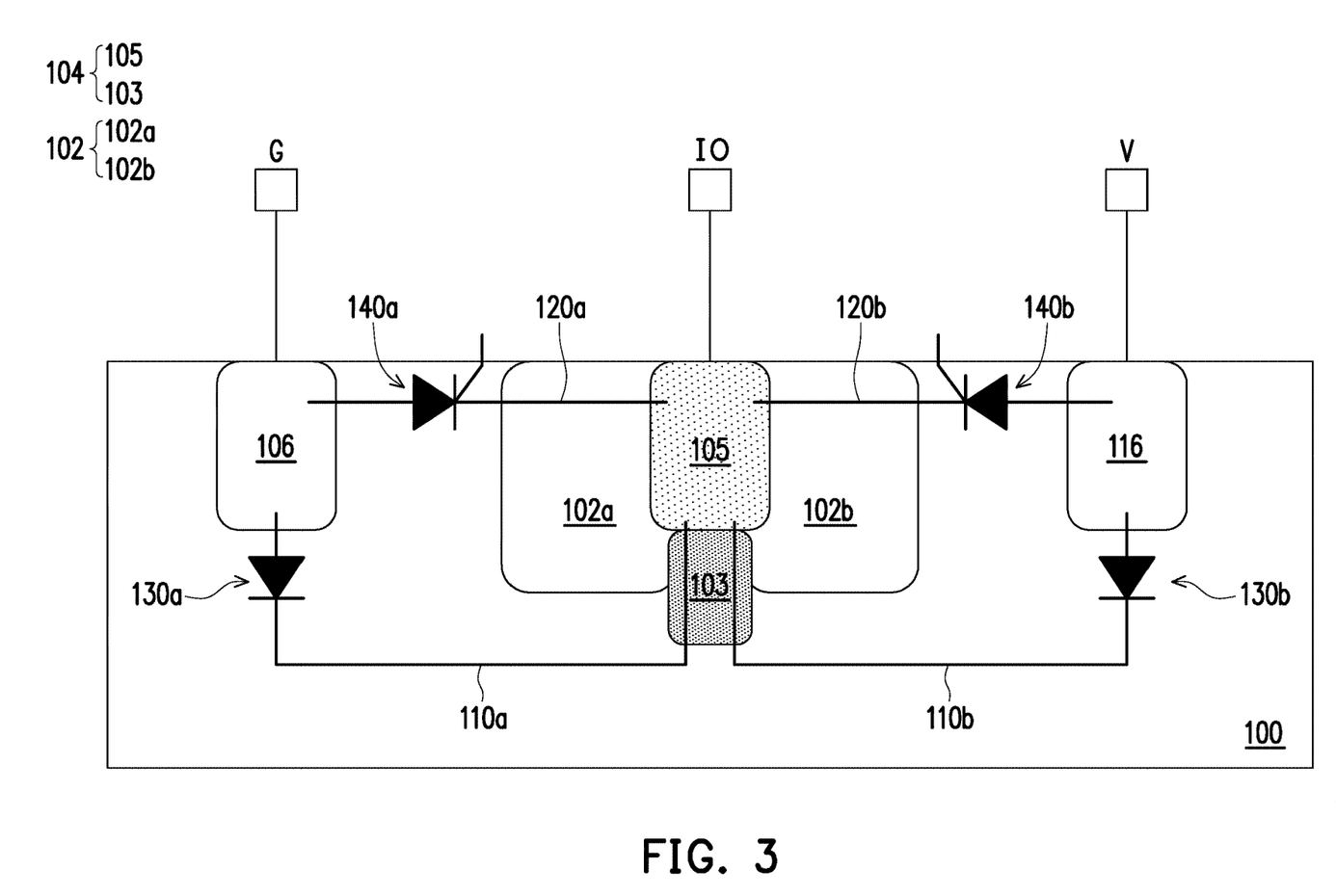
FIG. 3 is a schematic cross-sectional view of a semiconductor device according to a third embodiment of the invention.

FIG. 3 is a schematic cross-sectional view of a semiconductor device according to a third embodiment of the invention.

Referring to FIG. 3, a semiconductor device 30 of the third embodiment is similar to the semiconductor device 20 of the second embodiment. A difference there-between is that the first doped region 104 of the semiconductor device 30 of the third embodiment includes a first doped sub-region 103 and a second doped sub-region 105 located on the first doped sub-region 103. The first doped sub-region 103 may have a bottom surface lower than the bottom surfaces of the first and second well regions 102a and 102b. That is, the first doped sub-region 103 (or the first doped region 104) protrudes from the bottom surfaces of the first and second well regions 102a and 102b, so as to contact the substrate 100. In the structure, a current at the ground terminal G may flow from the current path 110a of the diode 130a or the current path 120a of the silicon controlled rectifier 140a to the input/output terminal IO. A current at the power terminal V may flow from the current path 110b of the diode 130b or the current path 120b of the silicon controlled rectifier 140b to the input/output terminal IO.

Figure 4:
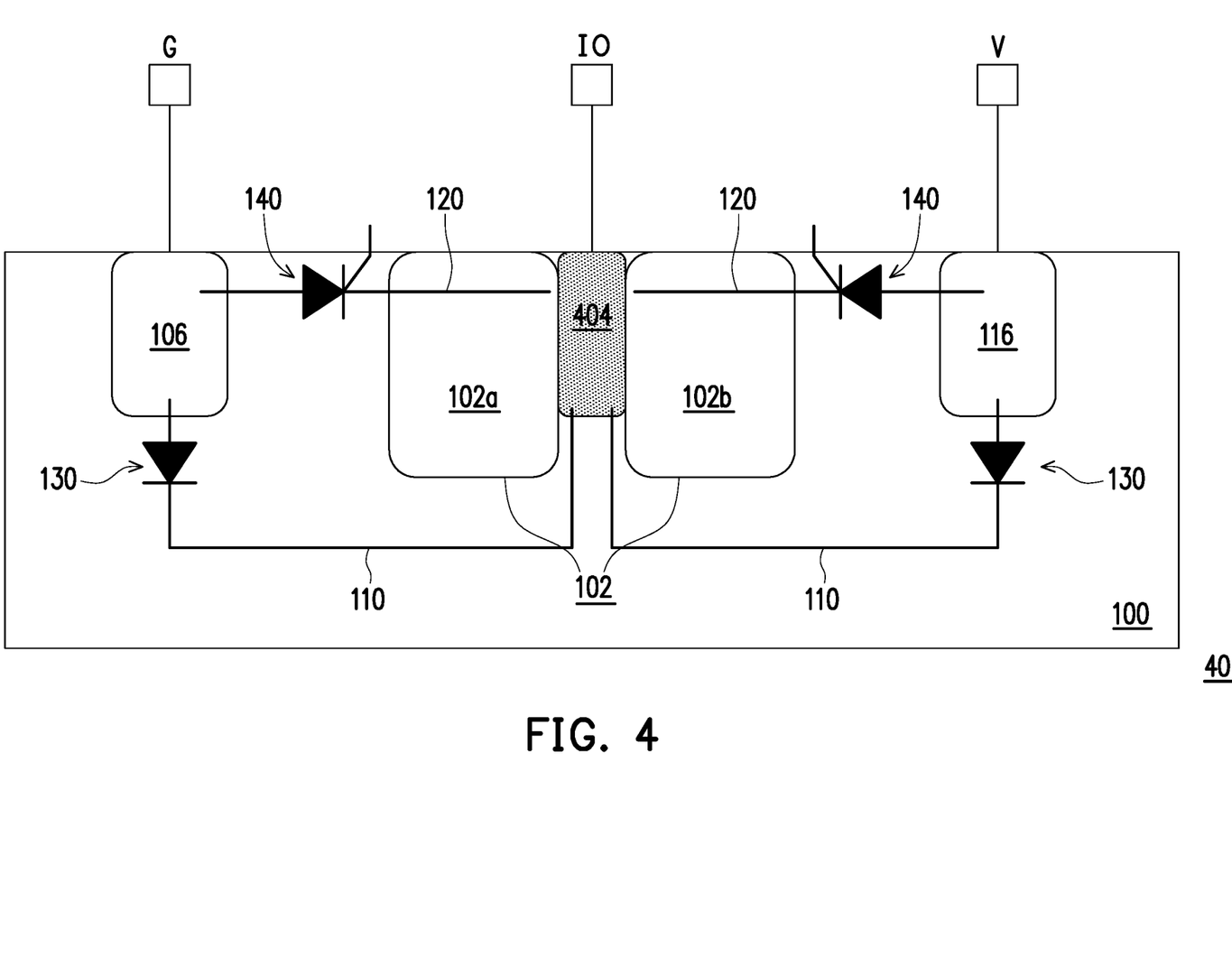
FIG. 4 is a schematic cross-sectional view of a semiconductor device according to a fourth embodiment of the invention.

FIG. 4 is a schematic cross-sectional view of a semiconductor device according to a fourth embodiment of the invention.

Referring to FIG. 4, a semiconductor element 40 of the fourth embodiment is similar to the semiconductor element 20 of the second embodiment. A difference there-between is that a first doped region 404 of the semiconductor element 40 of the fourth embodiment is only adjacent to the first and second well regions 102a and 102b. That is, the sidewalls of the first doped region 404 do not extend into the first and second well regions 102a and 102b. Accordingly, the first and second well regions 102a and 102b only cover or abut on the sidewalls of the first doped region 404, and not cover or wrap the bottom surface of the first doped region 404. In the case, as shown in FIG. 4, the entire bottom surface of the first doped region 404 is exposed by the first and second well regions 102a and 102b, and the entire bottom surface of the first doped region 404 is in contact with the substrate 100.

Based on the above, any one of the semiconductor devices 10, 20, 30, and 40 in FIGS. 1 to 4 is a hybrid configuration in which the diode 130 and the silicon-controlled rectifier 140 are integrated together. In the hybrid configuration, when an electrostatic discharge (ESD) or a surge occurs, the ESD current can be quickly conducted by the diode 130 to achieve a first-level of protection. Then, when the ESD energy continues to increase, the silicon controlled rectifier 140 will be triggered to achieve a second-level of high protection effect.

Figure 5:
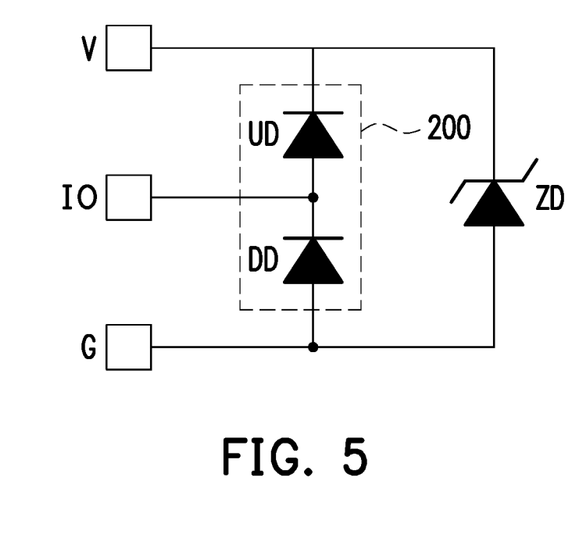
FIG. 5 is a circuit diagram of an electrostatic discharge protection device according to an embodiment of the invention.

FIG. 5 is a circuit diagram of an electrostatic discharge protection device according to an embodiment of the invention. The electrostatic discharge protection device of the present embodiment is described by using a transient voltage suppressor (TVS) as an example, but the present invention is not limited thereto.

Referring to FIG. 5, in the present embodiment, the ESD protection device includes a power terminal V, a ground terminal G, an input/output terminal IO, a Zener diode ZD, and a diode string 200. The diode string 200 includes diode structures UD and DD connected in series with each other. The Zener diode ZD and the diode string 200 are coupled in parallel between the power terminal V and the ground terminal G. As shown in FIG. 5, two ends of the Zener diode ZD are respectively coupled to the power terminal V and the ground terminal G; two ends of the diode structure UD are respectively coupled to the power supply terminal V and the diode structure DD; two ends of the diode structure DD are respectively coupled to the diode structure UD and the ground terminal G; and the input/output terminal IO is coupled between the diode structures UD and DD. In one embodiment, an anode of the diode structure UD is coupled to a cathode of the diode structure DD and is coupled to the input/output terminal IO. Although only a single diode structure UD and a single diode structure DD connected in series are illustrated in FIG. 5, the present invention is not limited thereto. In other embodiments, the number of the diode structures UD or the diode structures DD may be more than one. In addition, the number of diode strings 200 may also be adjusted according to actual needs.

In the present embodiment, any one of the semiconductor devices 10, 20, 30, and 40 in FIGS. 1 to 4 may replace the diode structure UD or the diode structure DD in the diode string 200 to achieve the effects of low capacitance, low on-resistance (low Ron), and reduced clamping voltage, thereby improving the ESD and surge protection capabilities of the ESD protection device.

Figure 6:
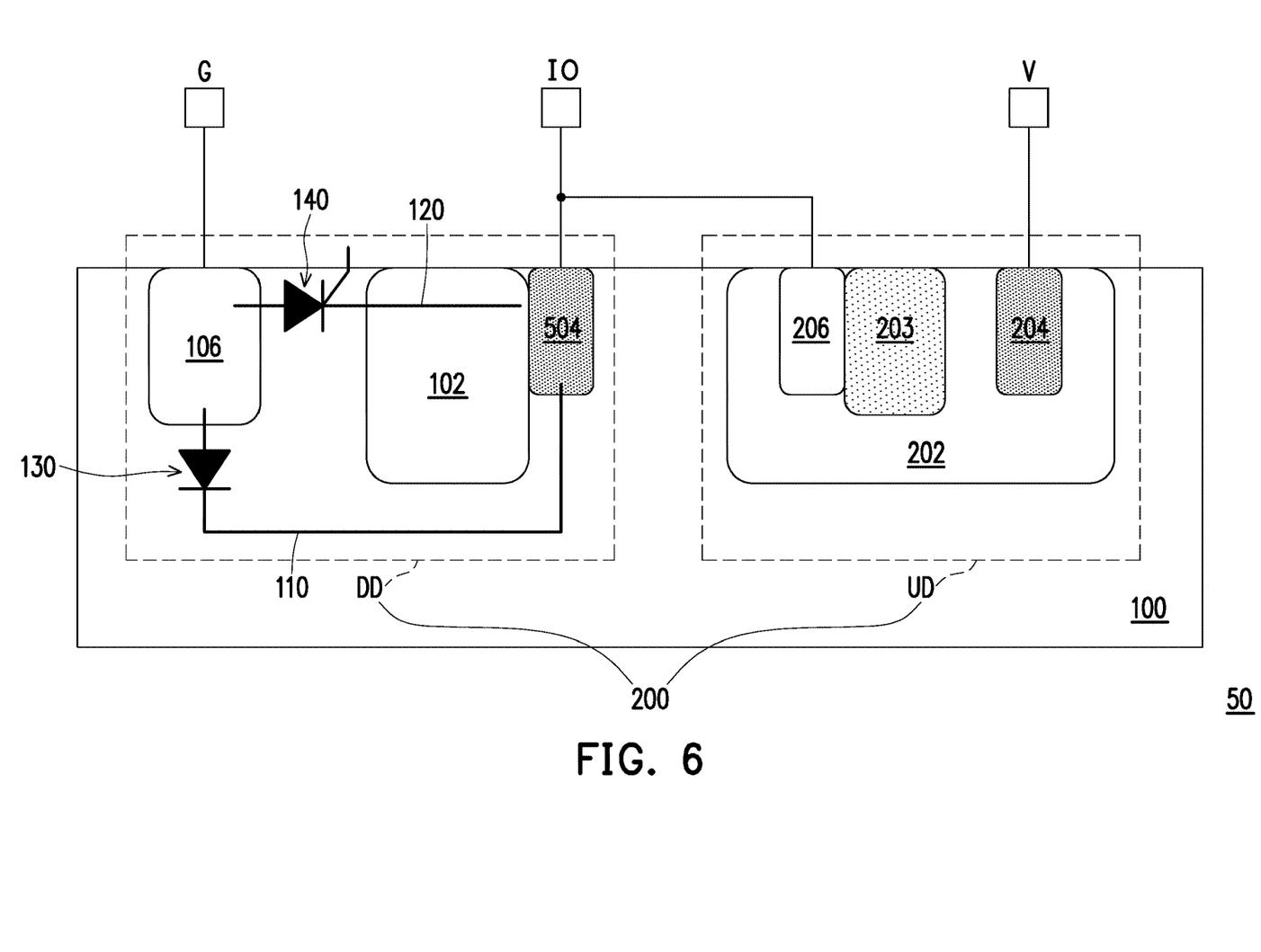
FIG. 6 is a schematic cross-sectional view of an electrostatic discharge protection device according to a fifth embodiment of the invention.

FIG. 6 is a schematic cross-sectional view of an electrostatic discharge protection device according to a fifth embodiment of the invention. The electrostatic discharge protection device of the present embodiment is described by taking a semiconductor device having a diode and a silicon controlled rectifier to improve the bypass diode structure in a transient voltage suppressor (TVS) as an example, but the present invention is not limited thereto.

Referring to FIG. 6, in the fifth embodiment, the ESD protection device 50 includes a diode string 200. The diode string 200 includes a diode structure UD and a diode structure DD. Although the present embodiment applies any one of the semiconductor devices 10, 20, 30, and 40 to the diode structure DD, the present invention is not limited thereto. In other embodiments, any one of the semiconductor devices 10, 20, 30, and 40 may be applied to the diode structure UD, or both of the diode structures UD and DD.

Specifically, the diode structure DD includes a substrate 100 having a first conductivity type, a well region 102 having a second conductivity type, a first doped region 504 having the first conductivity type, and a second doped region 106 having the second conductivity type. The well region 102, the first doped region 504, and the second doped region 106 are all disposed in the substrate 100. The well region 102 is located between the first doped region 504 and the second doped region 106. The well region 102 is adjacent to and in (physical) contact with the first doped region 504; the well region 102 is disposed separately from the second doped region 106 and is not in contact with the second doped region 106.

On the other hand, the diode structure UD includes the substrate 100 having the first conductivity type, the well region 202 having the second conductivity type (hereinafter referred to as a P-type well region 202), a well region 203 having the first conductivity type (hereinafter referred to as a N-type well region 203), a fourth doped region 204 having the first conductivity type, and a fifth doped region 206 having the second conductivity type. Specifically, as shown in FIG. 6, the N-type well region 203, the fourth doped region 204, and the fifth doped region 206 are all disposed in the P-type well region 202. That is, the P-type well region 202 wraps the N-type well region 203, the fourth doped region 204, and the fifth doped region 206 to isolate the diode structure UD from the diode structure DD. The N-type well region 203 is located between the fourth doped region 204 and the fifth doped region 206. The N-type well region 203 is adjacent to the fifth doped region 206 and in (physical) contact with the fifth doped region 206; and the N-type well region 203 is disposed separately from the fourth doped region 204 and not in contact with the fourth doped region 204.

In the present embodiment, the first doped region 504 and the fifth doped region 206 are coupled to the input/output terminal IO; the second doped region 106 is coupled to the ground terminal G; and the fourth doped region 204 is coupled to the power terminal V. In the case, a current path 110 of the diode 130 may be formed from the second doped region 106, the substrate 100 to the first doped region 504; while a current path 120 of the silicon controlled rectifier 140 may be formed from the second doped region 106, the substrate 100, the well region 102 to the first doped region 504. Accordingly, the ESD protection device 50 of the present embodiment may not only quickly conduct the ESD current by the diode 130, but also trigger the silicon controlled rectifier 140 to achieve a high ESD protection effect.

Figure 7:
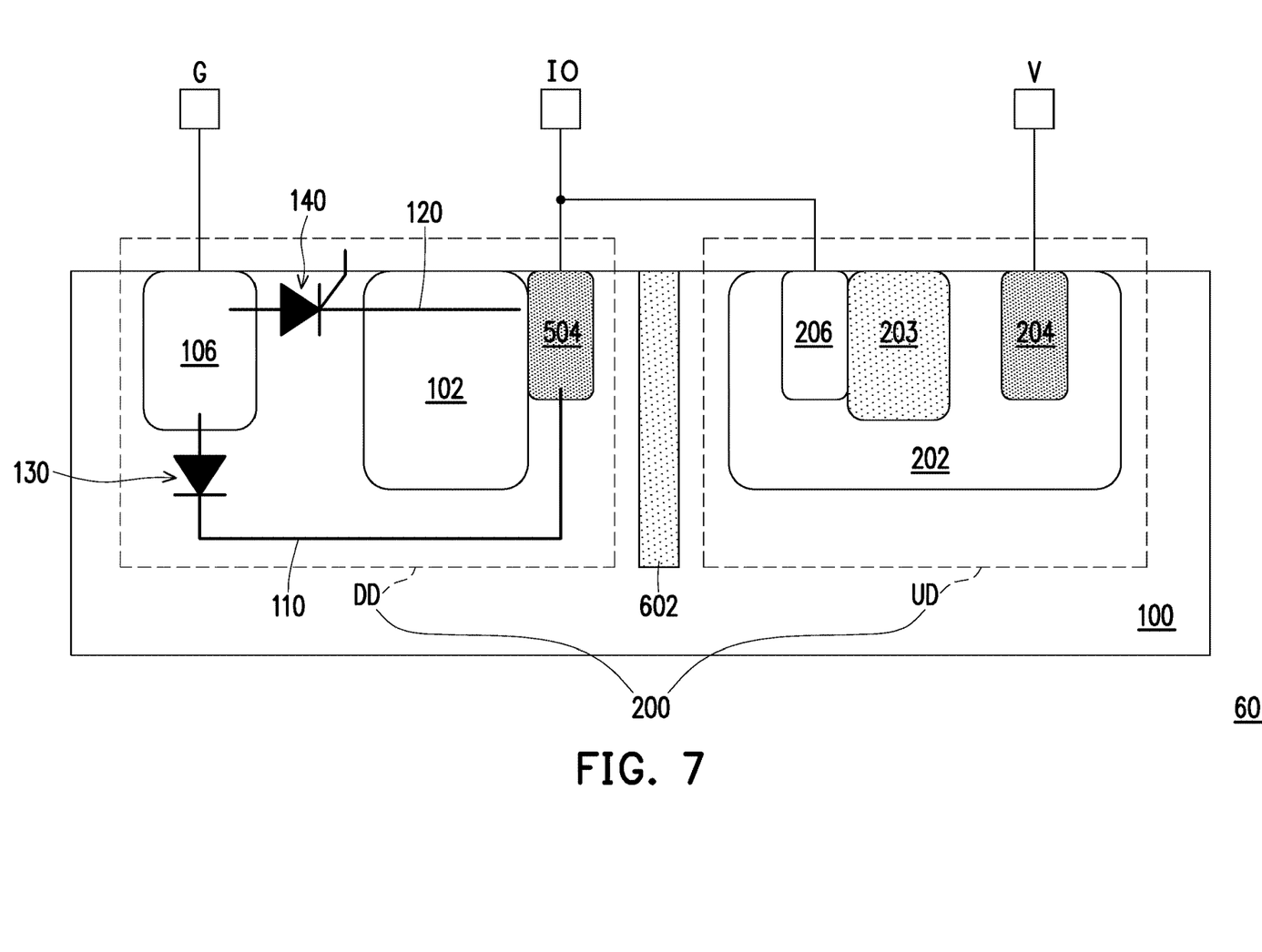
FIG. 7 is a schematic cross-sectional view of an electrostatic discharge protection device according to a sixth embodiment of the invention.

FIG. 7 is a schematic cross-sectional view of an electrostatic discharge protection device according to a sixth embodiment of the invention.

Referring to FIG. 7, an ESD protection device 60 of the sixth embodiment is similar to the ESD protection device 50 of the fifth embodiment. A difference there-between is that the electrostatic discharge protection device 60 of the sixth embodiment further includes an isolation structure 602 disposed in the substrate 100 between the diode structure UD and the diode structure DD, so as to separate the diode structure UD from Diode structure DD. In an embodiment, the isolation structure 602 may be a shallow trench isolation (STI) structure, a deep trench (DTI) isolation structure, or a combination thereof. A material of the isolation structure 602 may be silicon oxide, silicon nitride, or a combination thereof, for example. In alternative embodiments, the isolation structure 602 may also be an isolation doped region having the second conductivity type, such as a P-type doped region.

In summary, in the present invention, a diode and a silicon controlled rectifier are integrated into a bypass diode structure in a transient voltage suppressor (TVS). The hybrid structure not only has the advantages of the diode including small area, low capacitance, and fast turn-on, but also has the characteristics of the SCR including high current gain and low clamping voltage, thereby achieving better ESD protection effect.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor device with a diode and a silicon controlled rectifier (SCR), comprising:
    a substrate having a first conductivity type;
    a well region having a second conductivity type, and disposed in the substrate;
    a first doped region having the first conductivity type, and disposed in the substrate; and
    a second doped region having the second conductivity type, and disposed in the substrate,
    wherein the well region and the first doped region form a first PN junction, the well region and the substrate form a second PN junction, and the substrate and the second doped region form a third junction,
    wherein the first, second, and third PN junctions form the SCR, and the first doped region and the third PN junction form the diode,
    wherein the substrate has a path allowing the third PN junction and the first doped region to form the diode.

2. The semiconductor device according to claim 1, wherein a portion of the first doped region is located in the well region.

3. The semiconductor device according to claim 1, wherein the second doped region is separated from the well region and the first doped region.

4. The semiconductor device according to claim 1, wherein the substrate and the well region are both electrically floating.

5. The semiconductor device according to claim 1, wherein
    a current path of the diode is formed from the second doped region, the substrate to the first doped region; and
    a current path of the SCR is formed from the second doped region, the substrate, the well region to the first doped region.

6. The semiconductor device according to claim 1, wherein the first doped region comprises a first doped sub-region and a second doped sub-region, the second doped sub-region is located on the first doped sub-region, and the first doped sub-region has a doping concentration greater than a doping concentration of the second doped sub-region.

7. The semiconductor device according to claim 1, wherein the well region has a first well region and a second well region separated from each other, the first doped region is located between the first and second well regions, the first doped region is in contact with the first well region and the second well region respectively to form PN junctions, and the first doped region is in contact with the substrate.

8. The semiconductor device according to claim 7, further comprising:
  a third doped region having the second conductivity type, and disposed in the substrate, wherein the third doped region is separated from the well region by the substrate, and the first doped region is located between the second doped region and the third doped region.

\* \* \* \* \*